June 7, 1966 T. B. HUTCHINS IV., ET AL 3,255,393

METAL TO SEMICONDUCTOR RECTIFYING JUNCTION

Filed Dec. 4, 1961

INVENTORS.
THOMAS B. HUTCHINS, IV
GEORGE C. DOUGLAS

BY
BUCKHORN, CHEATHAM & BLORE
ATTORNEYS 3,255,393
Patented June 7, 1966

3,255,393

METAL TO SEMICONDUCTOR RECTIFYING JUNCTION

Thomas B. Hutchins IV and George C. Douglas, Beaverton, Oreg., assignors to Tektronix Inc., Beaverton, Oreg., a corporation of Oregon Filed Dec. 4, 1961, Ser. No. 156,703
9 Claims. (Cl. 317—234)

Figure 1:
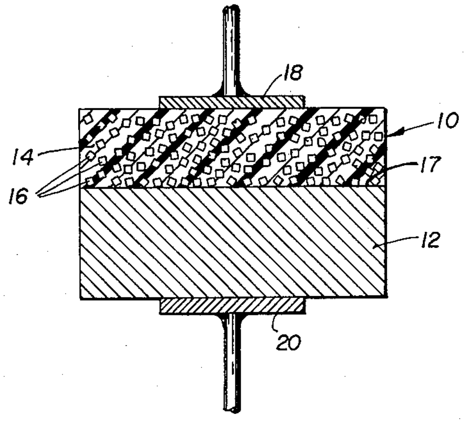

The subject matter of the present invention relates generally to semiconductor devices and in particular to metal-to-semiconductor rectifying junctions employed in semiconductor devices.

The metal-to-semiconductor rectifying junction of the present invention may be used in diodes, transistors, or other semiconductor devices which employ rectifying junctions to control the flow of electrical current. Briefly, the metal-to-semiconductor rectifying junction of the present invention includes a layer of insulating material containing a plurality of small metal particles distributed therein so that such layer is electrically conducting. This conducting layer is deposited upon a substrate body of semiconductor material which has been doped with current carrying impurities so that it is either N-type or P-type semiconductor material. The insulating material in the conductive layer functions as a binder to hold the metal particles in position and to bond the conductive layer to the semiconductor substrate body. The metal particles at the surface of the conductive layer which contact the semiconductor substrate body form a metal-to-semiconductor rectifying junction with the impurity doped semiconductor material.

Conventional rectifying contacts or junctions employed in semiconductor devices have certain disadvantages. The point contact type of rectifying junction is subject to failure caused by mechanical shock or vibration and has very small current carrying capabilities due to the fact that the rectifying contact is formed between the pointed end of a metal wire spring and the semiconductor material so that the electrical contact between the wire and semiconductor material is maintained by the mechanical spring action of the wire. The PN type of rectifying junction formed between two regions of semiconductor material containing different types of doping impurities may be produced by a plurality of different methods, but such methods require a high temperature heating step and the use of complicated and expensive apparatus. The metal-to-semiconductor rectifying junction of the present invention eliminates the above mentioned disadvantages of conventional point contact and PN-type rectifying junctions by the use of a simple, inexpensive, low temperature process to form a mechanically rigid connection between metal particles contained in an insulating binder and a substrate body of impurity doped semiconductor material.

Therefore, one object of the present invention is to provide an improved metal-to-semiconductor rectifying junction.

Another object of the invention is to provide an improved metal-to-semiconductor rectifying junction in which a conductive layer containing insulating material and metal particles is bonded to a substrate body of N-type or P-type semiconductor material so that at least some of such metal particles are in contact with such substrate body.

Another object of the present invention is to provide an improved method of making a metal-to-semiconductor rectifying junction in which a mixture of metal particles and insulating binder is formed and applied to the surface of a substrate body of N-type or P-type semiconductor material, and is thereafter hardened into a solid layer in order to bond this electrically conductive layer to such substrate body of semiconductor material.

A further object of the present invention is to provide an improved diode semiconductor device in which a metal-to-semiconductor rectifying junction is formed between a conductive layer containing metal particles in an epoxy resin binder and a substrate body of N-type or P-type semiconductor material.

A still further object of the present invention is to provide an improved transistor semiconductor device containing at least one metal-to-semiconductor rectifying junction formed between a conductive layer of metal particles in an epoxy resin binder and a substrate body of N-type or P-type semiconductor material.

Figure 2:
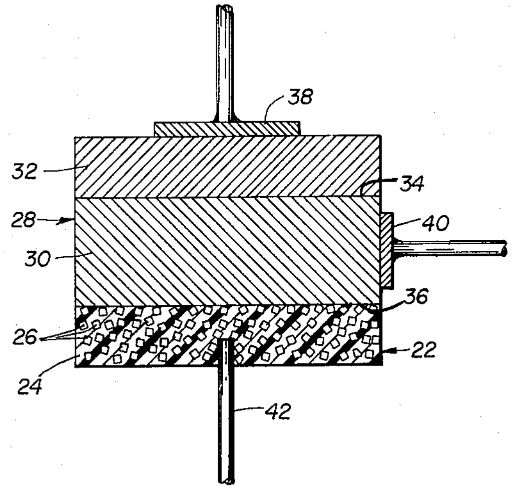

Additional objects and advantages of the present invention will become apparent from the following detailed description of preferred embodiments thereof shown in the attached drawings, of which:

FIG. 1 is a diagrammatic sectional view through a diode having a metal-to-semiconductor rectifying junction in accordance with the present invention, and FIG. 2 is a view similar to FIG. 1 showing a transistor employing a metal-to-semiconductor rectifying junction made in accordance with the present invention as its collector junction.

One embodiment of the present invention is a semiconductor diode shown in FIG. 1 as including a conductive layer 10 deposited on a substrate body 12 of N-type or P-type single crystalline semiconductor material, such as germanium, silicon or one of the group III–V intermetallic compounds including gallium-arsenide. The conductive layer 10 may include an insulating binder material 14, such as a low melting point glass or a low curing temperature epoxy resin, and a plurality of metal particles 16. The metal particles or other conductive material are dispersed throughout the insulating binder 14 in sufficient quantity to make the layer 10 electrically conductive. The metal particles 16 may be any metal, such as silver used when N-type gallium arsenide is employed for the body 12, which does not form an insulating oxide surface so that electrical contact is assured between adjacent particles and between the substrate body 12 and those particles at the surface of conductive layer 10 in engagement with the body 12 in order to form a metal-to-semiconductor rectifying junction 17. While the nature of the boundary condition existing between the conductive layer 10 and the semiconductor body 12 is not entirely clear, it appears to be analogous to a plurality of separate point contacts formed by the metal particles 16 at the surface of the layer 10 contacting the impurity doped semiconductor material of substrate body 12. Ohmic contacts 18 and 20 may be attached in any conventional manner to the conductive layer 10 and the semiconductor body 12, respectively, such as by soldering or the like. However, the ohmic contact 18 to the conductive layer 10 may be provided by merely inserting the lead wire into the soft conductive layer 10 while the insulating binder 14 is hardening as hereafter described with reference to FIG. 2.

A transistor made in accordance with the present invention is shown in FIG. 2 as having a conductive layer 22 similar to conductive layer 10 of FIG. 1 in that it contains an insulating binder 24 and a plurality of metal particles 26. This conductive layer 22 is bonded to a semiconductor substrate body 28 which contains a region 30 of P or N-type semiconductor material and region 32 of P or N-type semiconductor material having an electrical conductivity opposite to that of region 30 so that a PN junction 34 is formed between body region 30 and body region 32 of substrate body 28. This PN junction 34 may form the emitter junction of the transistor while the metal-to-semiconductor rectifying junction 36 formed between the metal particles 26 at the surface of conductive layer 22 and semiconductor body region 30 functions as the collector junction of the transistor.

Ohmic contacts 38, 40 and 42 may be attached to the emitter 32, base 30, and collector 22 of the transistor by conventional methods, such as soldering. However, ohmic contact 42 may also be attached to the conductive layer 22 by merely inserting the end of the lead wire into the soft conductive layer before insulating binder 24 has hardened and leaving it there until such insulating binder does harden thereby bonding the wire end inside the solid conductive layer. When glass or another thermoplastic insulating material is used for binder 24, ohmic contact 42 is positioned in the conductive layer 22 after the glass has been melted by heating above its melting point. The lead 42 is held in this position until the glass is cooled below its melting point and it has hardened into a solid material. When epoxy resin or another thermosetting insulating material is used for the binder 24 the lead wire 42 must be inserted into the soft conductive layer 22 while the epoxy resin is curing and held in that position until the resin has been completely cured so that the conductive layer has hardened into a solid material.

The insulating binders 14 and 24 may be any suitable thermo-setting or thermo-plastic insulating material which has a curing temperature or a melting point below that of the metal particles 16 and 26 and below that of the substrate bodies 12 and 28, and will firmly bond the conductive layer to the semiconductor substrate body to provide a waterproof coating which is substantially inert and dimensionally stable. If the hardened binder is a brittle material such as glass, it preferably has approximately the same thermal coefficient of expansion as the semiconductor material, the metal particles and the electrical leads with which it is in contact.

Epoxy resins are particularly suitable for the insulating binder. Such resins can be prepared by forming the reaction product of epichlorohydrin and any one of, or a mixture of, organic compounds having a plurality of reactive groups thereon such as hydroxyl or carboxyl groups with the liberation of hydrochloric acid during the reaction and then polymerizing such reaction product either by itself or in combination with other polymerizable materials to form a copolymer. These organic compounds are usually polyphenols such as bisphenol-A. The epoxy resins are supplied commercially in monomeric or partly polymerized form and may be modified by admixture with other polymerizable materials such as phenolic resins. A suitable polymerization catalyst, which is usually an acidic material, is also supplied either as a separate ingredient to be admixed with the epoxy resin material or as a heat activated catalyst already admixed with the epoxy resin material. Two conductive epoxy resins each containing a filler of silver powder have been found to be particularly suitable for the material of the conductive layers 10 and 22. These conductive epoxy resins are commercially available from Epoxy Products, Inc., of Irvington, New Jersey, under the trade name of "Conductive Epoxy Resin Cement" No. 3022 and No. 3012 which are room-curing and heat-curing epoxy resins, respectively.

The room-curing epoxy resin cement is supplied as two separate materials, one being a catalyst and the other the epoxy resin with a silver powder filler, which must be mixed together to form a paste. This paste may then be applied in a thin layer on the cleaned surface of the substrate body 12 or 28 of doped semiconductor material, such as N-type gallium-arsenide. The substrate body of gallium-arsenide may be cleaned by any conventional methods including chemically etching the surface thereof to remove all foreign matter and harmful oxides. After the conductive layer of epoxy resin and silver particles has been applied to the semiconductor body, the resin may be allowed to cure at room temperature until it hardens into a solid conductive layer 10 or 22 which is bonded to the semiconductor body. The application of heat to the room-curing epoxy resin will speed up the curing operation, but it is not essential. Lead wires of silver may then be soldered to the layer 10 and the body 12, or one may be positioned in the conductive layer during curing and held in position until the resin has hardened in the manner above described. The use of the heat-curing epoxy resin cement is similar to that already described with reference to the room-curing cement except that no additional mixture of catalyst with the silver filled resin is necessary and heat is required for curing. Thus, the epoxy resin paste must be heated to approximately 80° C. or more for a sufficient time to completely cure the resin and harden the paste into a solid conductive layer. Pressure may be applied to the conductive layer while the resin is curing in order to assure proper bonding of the layer to the semiconductor material by any suitable means.

It will be apparent that various changes may be made in the details of the preferred embodiments of the present invention without departing from the spirit of the invention. For example, two conducting layers may be used in the transistor of FIG. 2 so that the semiconductor body region 32 is replaced by a second layer similar to conducting layer 22 if it is desired to have a metal-to-semiconductor rectifying junction as the emitter junction 34 in addition to the collector junction 36. The current carrier injection efficiency of such an emitter junction is, however, not as great as that of a conventional PN junction. It is, therefore, not intended to limit the scope of the present invention to the above detailed description of certain preferred embodiments thereof but such scope should be determined by the following claims.

We claim:

1. A semiconductor device having a large area conductor-to-semiconductor rectifying junction, comprising;
 a body of semiconductor material containing current carrier doping impurities; and
 means for supporting and containing a plurality of conductor particles with at least some of said particle in contact with said body to form a conductor-to-semiconductor rectifying junction with said body, said junction having a large area approximately equal to a cross section of said body of semiconductor material parallel to said junction to provide a high current conducting capability.

2. A semiconductor device having a metal-to-semiconductor rectifying junction, comprising:
 a body of semiconductor material containing current carrier doping impurities; and
 a layer of insulator material containing a plurality of solid metal particles dispersed throughout the layer in a sufficient quantity to render said layer electrically conductive, said layer being positioned in contact with and bonded to said body so that at least some of said particles are in engagement with said body to form a metal-to-semiconductor rectifying junction with said body, said junction having a large area approximately equal to a cross section of said body of semiconductor material parallel to said junction to provide a high current conducting capability.

3. A semiconductor device having a metal-to-semiconductor rectifying junction, comprising:
 a body of semiconductor material containing current carrier doping impurities; and
 a layer of thermo-plastic insulator material containing a plurality of metal powder particles in sufficient quantity to render said layer electrically conductive, said layer being positioned in contact with said body so that some of said particles are in engagement with said body to form a metal-to-semiconductor rectifying junction with said body, said junction having a large area approximately equal to a cross section of said body of semiconductor material parallel to said junction to provide a high current conducting capability.

4. A semiconductor device having a metal-to-semiconductor rectifying junction, comprising:
 a body of gallium-arsenide semiconductor material containing predominantly N-type doping impurities; and a layer of epoxy resin insulator material containing a plurality of silver powder particles of sufficient amount so that said layer is electrically conductive, said layer being positioned in contact with and bonded to said body so that some of said particles are in engagement with the surface of said body to form a metal-to-semiconductor rectifying junction with said body, said junction having a large area approximately equal to a cross section of said body of semiconductor material parallel to said junction to provide a high current conducting capability.

5. A semiconductor diode having a conductor-to-semiconductor rectifying junction, comprising:

a body of semiconductor material containing current carrier doping impurities;

a layer of insulator material containing a plurality of solid conductor particles of sufficient quantity to render said layer conductive, said layer being coated on a surface of said body so that some of said particles are in engagement with said surface of said body to form a conductor-to-semiconductor rectifying junction with said body, said junction having a large area approximately equal to a cross section of said body of semiconductor material parallel to said junction to provide a high current conducting capability; and a pair of metal contacts attached to said body and said layer so that one of said contacts forms an ohmic contact with said body and the other of said contacts forms an ohmic contact with said layer but is spaced from the particles engaging said body.

6. A semiconductor diode having a metal-to-semiconductor rectifying junction, comprising:

a body of semiconductor material containing current carrier doping impurities;

a layer of epoxy resin insulator material containing a plurality of solid metal particles of sufficient quantity to make said layer electrically conductive, said layer being in contact with a surface of said body so that some of said particles are in engagement with said surface of said body to form a metal-to-semiconductor rectifying junction with said body, said junction having a large area approximately equal to a cross section of said body of semiconductor material parallel to said junction to provide a high current conducting capability; and a pair of metal leads attached to said body and said layer so that one of said leads forms an ohmic contact with said body and the other of said leads forms an ohmic contact with said layer but is spaced from the particles engaging said body.

7. A semiconductor diode having a metal-to-semiconductor rectifying junction, comprising:

a body of gallium-arsenide semiconductor material containing N-type doping impurities;

a layer of thermosetting epoxy resin insulator material containing a plurality of silver powder particles of sufficient amount to make said layer electrically conductive, said layer being coated on the surface of said body so that some of said particles are in engagement with said body to form a metal-to-semiconductor rectifying junction with said body, said junction having a large area approximately equal to a cross section of said body of semiconductor material parallel to said junction to provide a high current conducting capability; and a pair of metal leads attached to said body and said layer so that one of said leads forms an ohmic contact with said body and the other of said leads forms an ohmic contact with said layer but is spaced from the particles engaging said body.

8. A transistor having a metal-to-semiconductor rectifying junction therein, comprising:

a body of semiconductor material containing a PN junction therein;

a layer of thermo-setting epoxy resin insulator material containing a plurality of metal particles to make said layer electrically conductive, said layer being bonded to the surface of said body remote from said PN junction so that the metal particles on the inner surface of said layer are in engagement with said body to form a metal-to-semiconductor rectifying junction with said body; and a plurality of electrical leads attached to said body and said layer so that at least two of said leads form an ohmic contact with said body and another of said leads forms an ohmic contact with metal particles in said layer so that said metal-to-semiconductor junction is connected as the collector junction and said PN junction is connected as the emitter junction of said transistor.

9. A semiconductor device having a metal-to-semiconductor rectifying junction therein, comprising:

a body of semiconductor material containing a PN junction therein;

a layer of insulator material containing a plurality of metal particles to make said layer electrically conductive, said layer being bonded to the surface of said body remote from said PN junction so that the metal particles on the inner surface of said layer are in engagement with said body to form a metal-to-semiconductor rectifying junction with said body; and a plurality of electrical leads attached to said body and said layer so that at least two of said leads form ohmic contacts with said body on opposite sides of said PN junction and another of said leads forms an ohmic contact with metal particles in said layer.

References Cited by the Examiner

UNITED STATES PATENTS

| | | | |
|---|---|---|---|
| 1,319,804 | 10/1919 | Sjostrom | 317—236 |
| 2,530,745 | 11/1950 | Wallace | 317—235 |
| 2,758,261 | 8/1956 | Armstrong | 317—235 |
| 2,762,957 | 9/1956 | Rothlein | 317—236 |
| 2,798,989 | 7/1957 | Welker | 317—237 |
| 2,884,576 | 4/1959 | Lehovec | 317—236 |
| 2,904,704 | 9/1959 | Marinace | 307—88.5 |

JOHN W. HUCKERT, *Primary Examiner.*

JAMES D. KALLAM, *Examiner.*

J. A. ATKINS, *Assistant Examiner.*